United States Patent [19]

Luger

[11] 4,012,199
[45] Mar. 15, 1977

[54] CHEMICAL REACTION AND PRODUCTION SYSTEMS WITH A SPECTRO-OPTICAL DIGITIZER

[75] Inventor: Paul P. Luger, Spokane, Wash.

[73] Assignee: The Pioneer Educational Society, Portland, Oreg.

[22] Filed: Sept. 4, 1975

[21] Appl. No.: 610,190

Related U.S. Application Data

[63] Continuation-in-part of Ser. Nos. 32,578, April 28, 1970, Pat. No. 3,875,410, and Ser. No. 238,574, March 27, 1972, Pat. No. 3,999,063, and Ser. No. 404,180, April 9, 1972, Pat. No. 3,998,694, and Ser. No. 563,158, March 28, 1975.

[52] U.S. Cl. .......................... 23/253 A; 250/231 R; 324/109
[51] Int. Cl.² .................... G01D 5/34; G01N 21/28
[58] Field of Search ................ 23/230 A, 253 A; 250/231 R, 376; 324/109; 235/151.12

[56] References Cited

UNITED STATES PATENTS

| | | | |
|---|---|---|---|
| 2,986,697 | 5/1961 | Luger | 250/231 R |
| 3,133,248 | 5/1964 | Shonka | 324/109 |
| 3,475,392 | 10/1969 | McCoy et al. | 23/253 A |
| 3,791,793 | 2/1974 | Friedmann et al. | 23/253 A |

Primary Examiner—R.E. Serwin

[57] ABSTRACT

Several digital sensing devices are described for use in automated production systems. The first described is for use in the automatic operation of a reactor. This device employs a binant electrometer using a quartz fiber mounted at one end but free to vibrate at the other in an AC field. The fiber oscillates if a charge is placed upon it. An optical slit replaces the ordinary eyepiece reticule scale. With the quartz fiber adjusted so its image is in focus at the optical slit, photoelectric signals are obtained at null charge on the fiber. The quartz fiber is repeatedly charged and allowed to discharge by collecting ions from a source under measurement. Each photoelectric signal causes a digital time reading to be taken. The time readings are used to evaluate the current due to the collected charge. The photoelectric signals, by feedback, also operate the electrometer for continuous or intermittent-continuous operation. Basically, the system is a current digitizer. Further application is also described for the monitoring and control of chemical reactions for production systems. Finally, other types of sensing devices are described; namely, an optical digitizer, a flow optical digitizer a spectro-optical digitizer and a spectro-line intensified digitizer. The use of each in automated controlled processes is shown.

26 Claims, 19 Drawing Figures

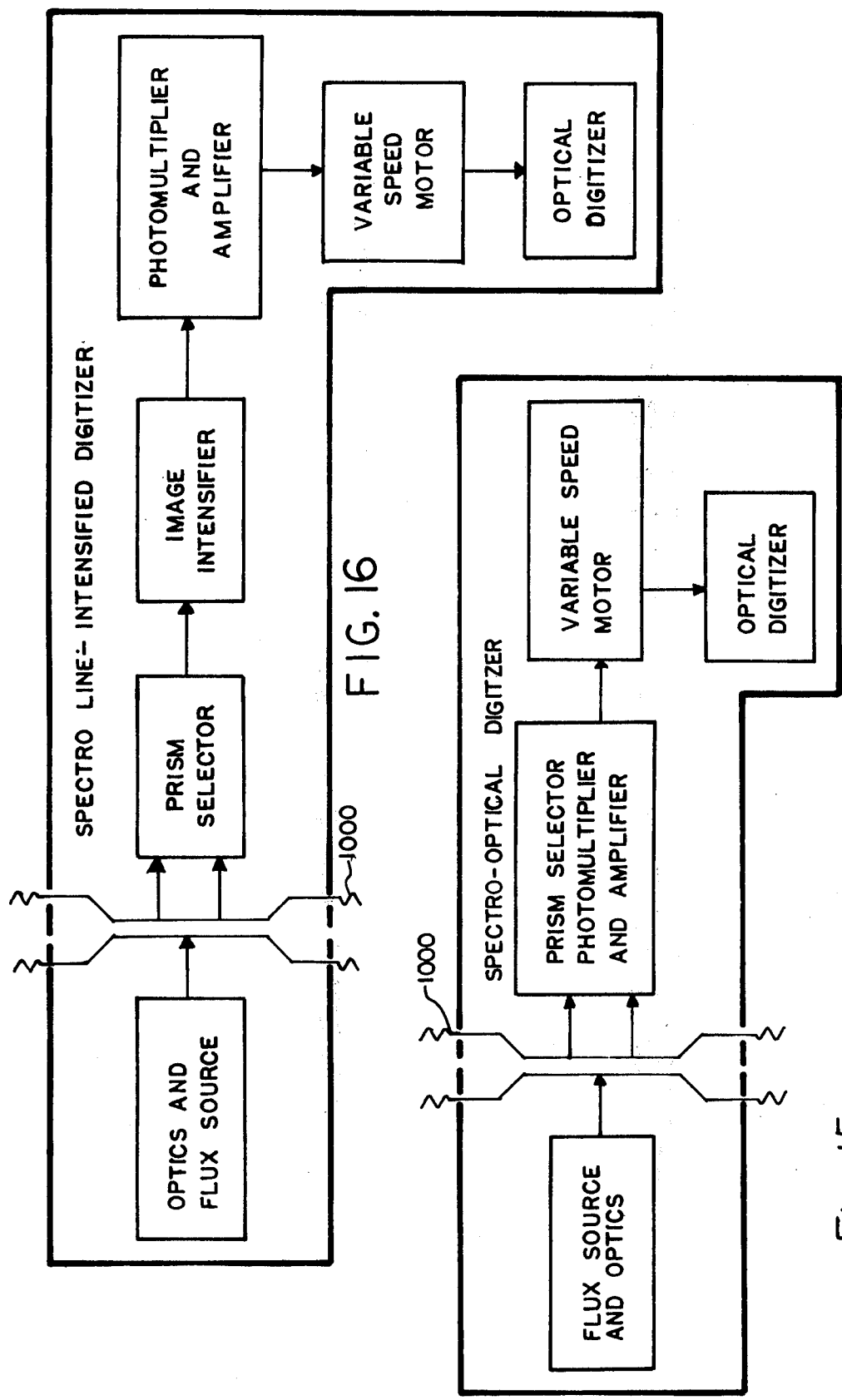

CHEMICAL REACTION AND PRODUCTION SYSTEMS WITH A SPECTRO-OPTICAL DIGITIZER

This invention is a continuation-in-part of a previous application, Ser. No. 32,578, Apr. 28, 1970, U.S. Pat. No. 3,875,410 entitled: RADIATION DETECTOR USING A DIGITAL ELECTROMETER SCALER.

Other continuations-in-part are the following: Ser. No. 238,574, now U.S. Pat. No. 3,999,063, Mar. 27, 1972 entitled: OPTICAL MEASURING SYSTEM WITH DIGITAL ELECTROMETER SCALER, also Ser. No. 404,180, Apr. 9, 1972, now U.S. Pat. No. 3,998,644 entitled: NUCLEAR REACTOR AND PRODUCTION SYSTEMS WITH DIGITAL CONTROL, and also, Ser. No. 563,158, Mar. 28, 1975 entitled: NUCLEAR REACTOR AND PRODUCTION SYSTEMS WITH A FLUX-OPTICAL DIGITIZER.

BACKGROUND OF THE INVENTION

This invention relates to deflection instruments and their use for the measurement of various kinds of forces; in particular, it relates to an improved method and means for the continuous monitoring and recording of the phenomena measured by such instruments. In certain respects, this application is similar to a former publication, U.S. Pat. No. 2,986,697. However, it contains substantial improvements and innovations beyond those described in the earlier patent.

In many deflection instruments, the forces deflecting the movable element are subject to a field of force of one kind or another: where the relationship between the field and the forces or between the forces themselves are known, measurements may be undertaken. For example, when an electrostatic field of force controls the movement of a member that is collecting an electric charge, an electric current may be measured. Known physical laws relate the average current and the rate of deflection of the movable element.

More in particular, it is often desirable to use a quartz fiber electrometer in conjunction with an ionization chamber for radiation measurements. A well-designed electrometer is sufficiently accurate to be employed as a secondary standard but requires operator observation of the rate of deflection of the electrometer needle. The need for continuous operator attention has inhibited use of an electrometer for routine measurements despite its many desirable characteristics.

It is therefore an object of this invention to provide an improved method for the automatic monitoring of the phenomena measured by such deflection instruments.

It is also the object of this invention to provide other types of deflection instruments which are useful in various manufacturing, production or controlled process operations. These new types of deflection instruments have similar properties to the automatically operated electrometer which will first be described.

The electrometer is a deflection instrument having a movable element in an electric field of force. Since the field is electric the forces will be produced by electric charges (of opposite sign) supplied to the moving element. Also, associated with this instrument is a source of illumination and an optical system adjusted to focus the real image of the deflection element (usually provided in the form of a needle clamped at one end and free to vibrate at the other) upon an optical mask having one slit thereon. A photoelectric cell is either mounted behind the slit or is connected to the slit by means of fiber optics so that signals may be generated when the deflection element is in a null condition. The signals generated through the instrumentality of the real-image-optical-slit-photocell arrangement are then employed both to operate a feedback control for the instrument itself, as well as to control digital time counters and recorders, thus to store in memory digital information of the rate of change of the potential of the needle due to the charge accumulating thereon.

In employing such a unit of invention in connection with an ion chamber and a quartz fiber needle electrometer for the measurement of radiation, the "rate of charge" or "drift" method is employed and currents of less than about $10^{-16}$ ampere may be measured.

In the device first to be described, time is the dependent variable and is the principal quantity under measurement. Independent variables, such as voltage, may be set by control nobs or are variables to be measured, as is the electric current with quartz fiber electrometers. Constants are either built into the device or are set by controls. As a result, all measurements appear as digital, time-interval readings. This makes it natural for automatic readout as on a tape or card together with visual display of the reading if desired.

The arrangement thus generally described provides for fully automatic operation of the scaler of digitizer eliminating the necessity for attendance by a trained operator. As a digitizer the instrument makes possible the change of information from analog to digital form. Another important object of this invention is to describe an automatic method of taking current measurements with an electrometer on a continuous basis.

This is possible since the time required for sensitivity measurements is completely eliminated and the dead time between measurements may be a minimum, constant time interval, (less than a second). Thus, all measurements can be made in real time.

A further object of this invention is to apply this digitizing, flux-measuring equipment to the control of a nuclear reactor. Not only does such a digitizer afford a means of obtaining reactor flux levels at several places simultaneously in the core lattice, and at frequent, almost continuous intervals, but these readings may be further used to obtain automatic control of the reactor's power output.

Another object of this invention is to employ rotating arm or deflecting arm instruments as optical, analog-to-digital converters. In these instruments, the real image of the deflecting arm may be used to derive time interval measurements in an optical slit-phototransducer system; or the moving arm itself may cause the interruption of optical flux incident upon the optical-slit-phototransducer arrangement.

The following description and accompanying drawings will more fully describe the purpose of this invention:

IN THE DRAWINGS

Figure 3:
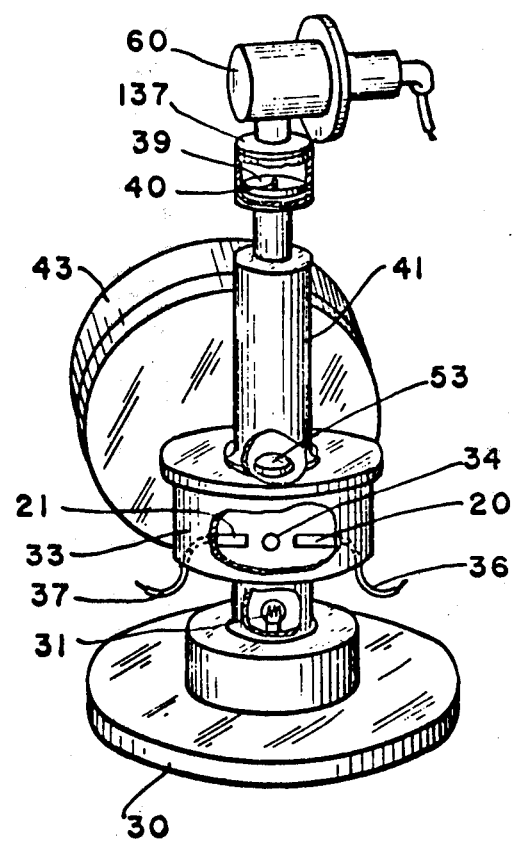

FIG. 3 indicates the general arrangement of one form of apparatus embodying the invention.

Figure 4:
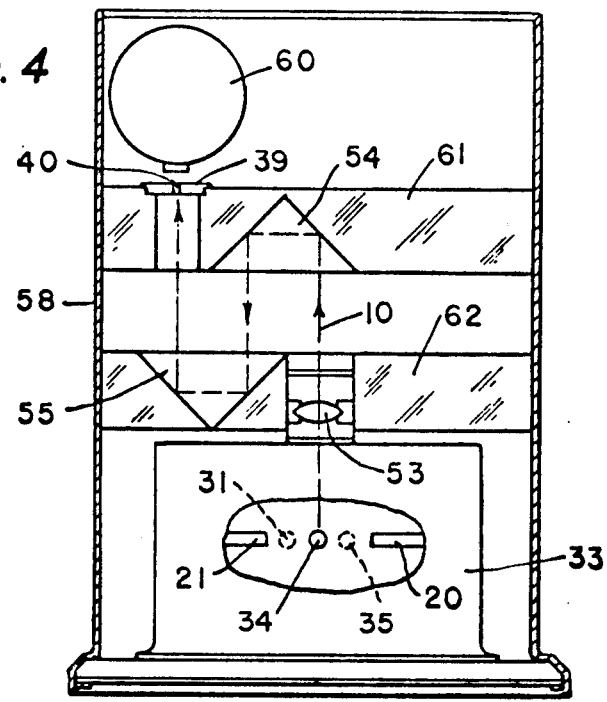

FIG. 4 illustrates the optics associated with the electrometer in an embodiment of the invention.

Figure 5:
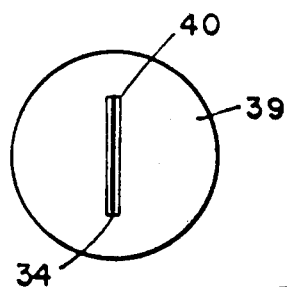

FIG. 5 illustrates an optical slit with the needle in a nulled, i.e., equilibrium position.

Figure 5A:
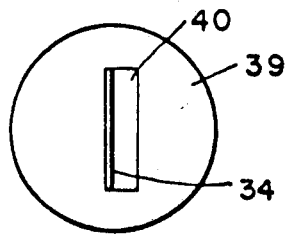

FIG. 5A illustrates a mechanical, adjustable optical slit, opened for adjustment purposes.

Figure 5B:
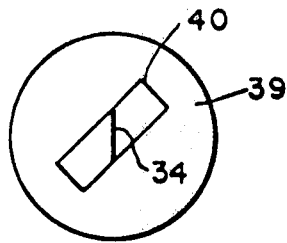

FIG. 5B illustrates the same optical slit shown in FIG. 5A but rotated so as to further facilitate adjustment.

Figure 6:
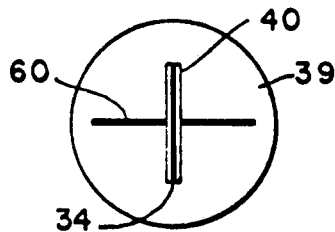

FIG. 6 shows a fixed optical slit together with an auxiliary slit useful for making optical alignment adjustments.

Figure 7:
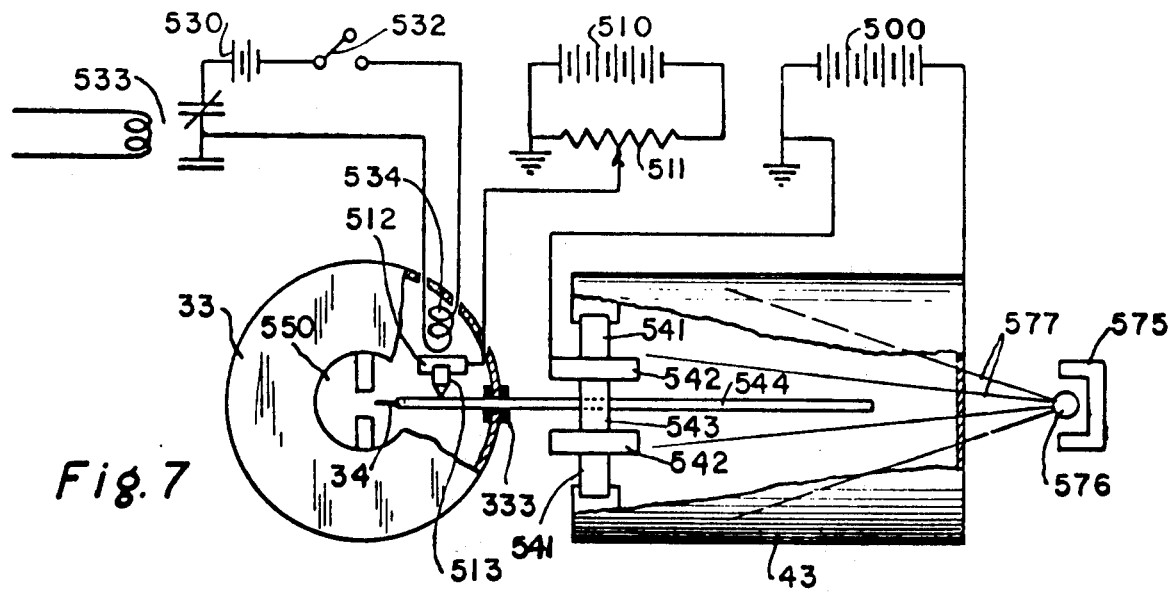

FIG. 7 illustrates an arrangement of electrical circuits useful in the practice of the invention.

Figure 8:
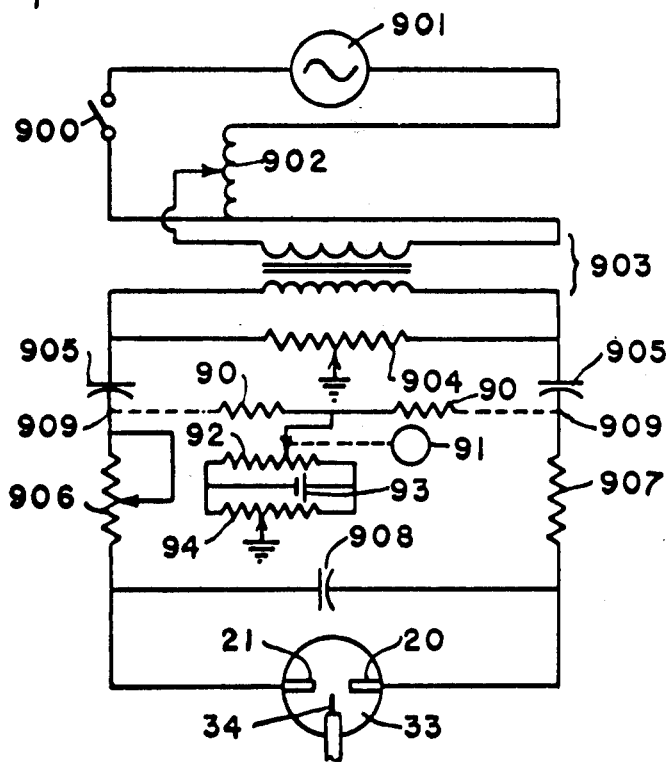

FIG. 8 shows a schematic circuit diagram for the AC potential supply for the vibrating fiber electrometer.

Figure 9:
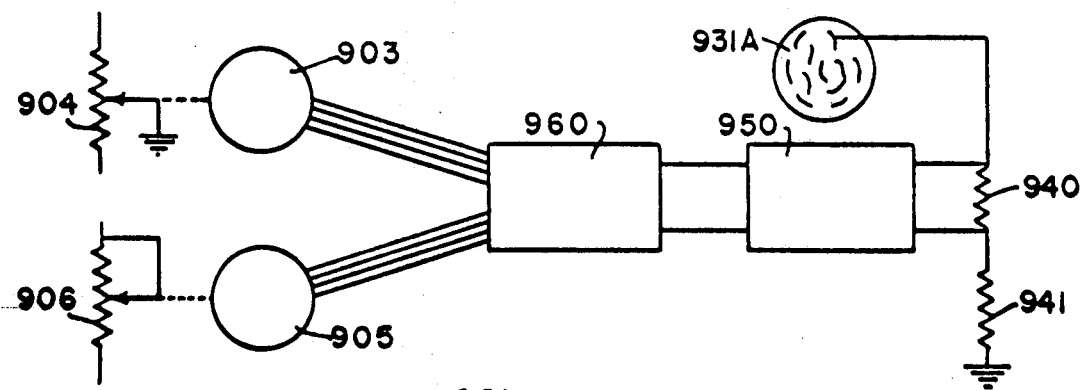

FIG. 9 shows one method for making automatic adjustment of potentiometers for AC null control.

Figure 10:
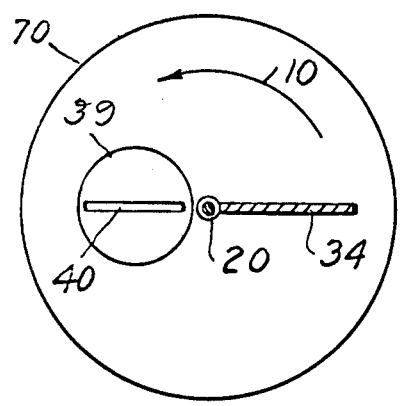

FIG. 10 is an optical-aperture, rotating arm light chopper - simply called a light chopper. It is useful in changing analog to digital signals.

Figure 11:
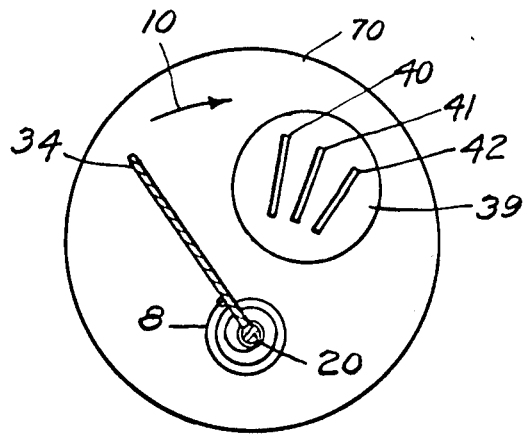

FIG. 11 is an optical-aperture, rotating arm angle indicator useful as a rate meter.

Figure 12:
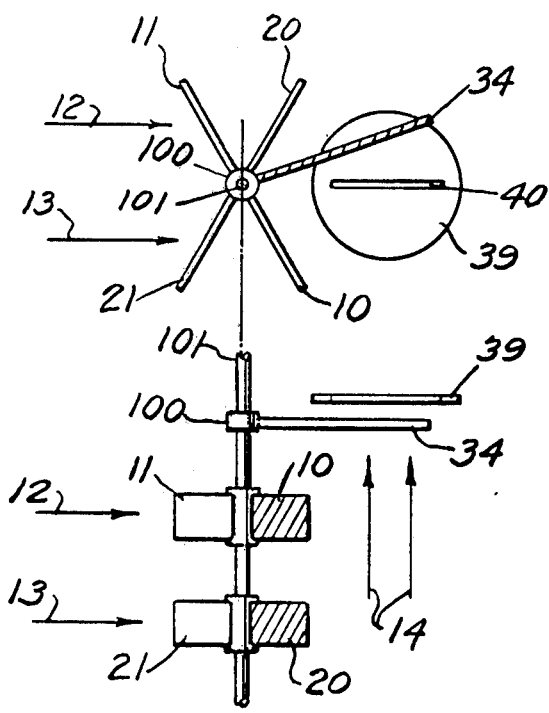

FIG. 12 is a flux driven, optical-aperture, rotating arm, light chopper useful in changing signals from analog to digital. It is designed to employ radiant flux as its driving force. A side and top view are shown.

Figure 13:
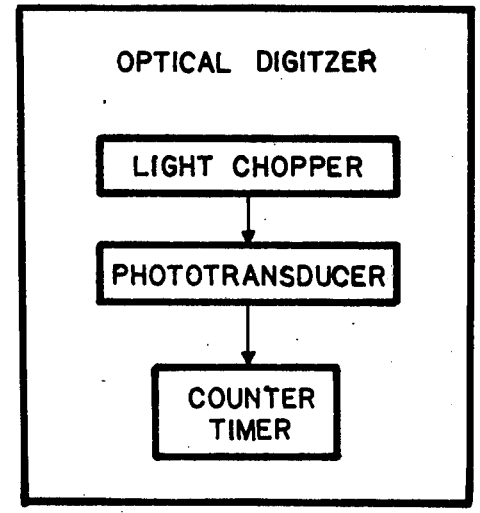

FIG. 13 shows the components of an optical digitizer.

Figure 14:
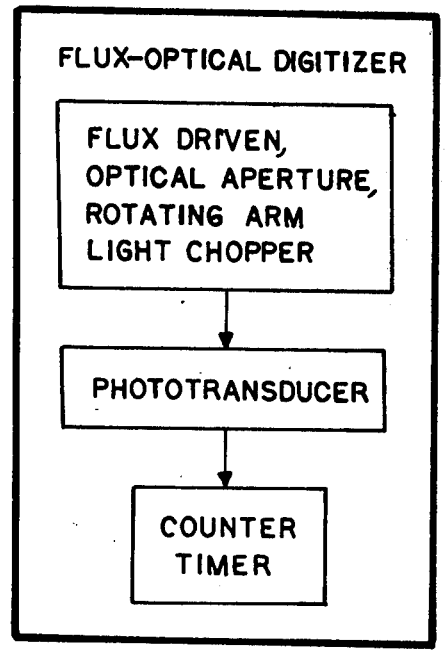

FIG. 14 shows the components of a flux-optical digitizer.

FIG. 15 shows the components of a spectro-optical digitizer and the spectral source.

FIG. 16 shows the components of a spectro line-intensified digitizer.

Figure 17:
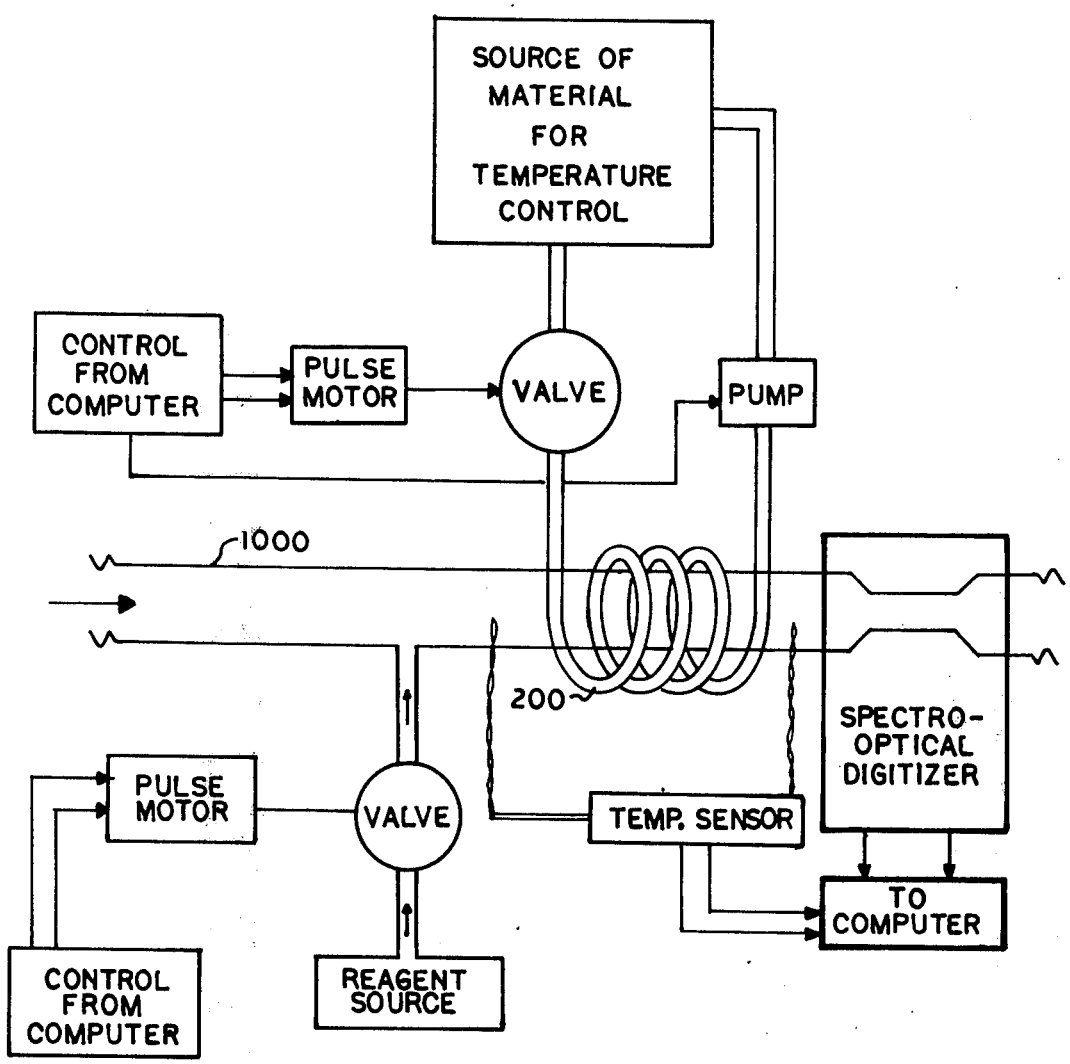

FIG. 17 shows a general arrangement to obtain automatic control of reagent input to a reaction vessel and for temperature regulation of the vessel.

Figure 1:
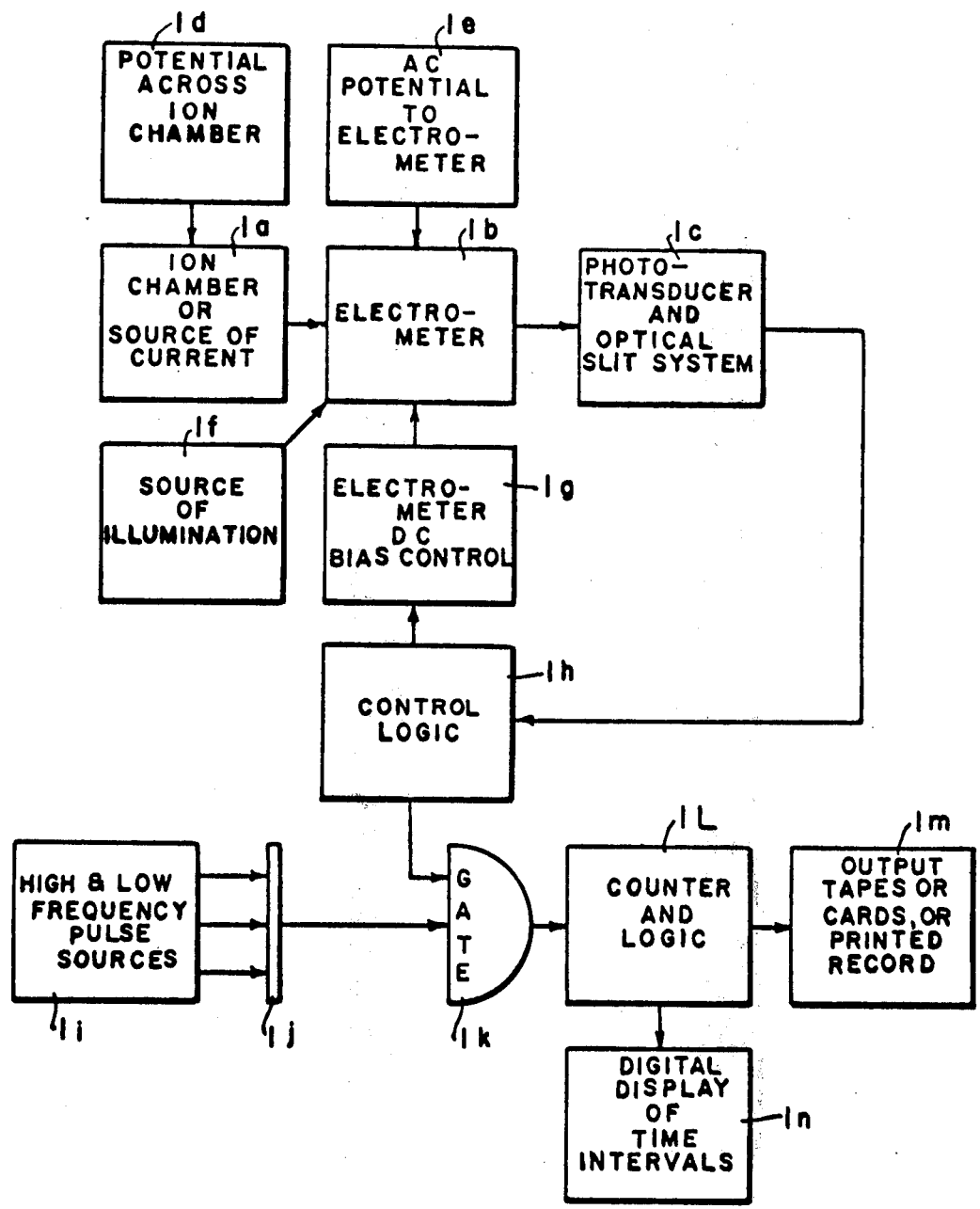
FIG. 1 shows a block diagram of a precision radiation measuring device.

Referring now to the block diagram of FIG. 1, a general purpose precision radiation measuring system is shown. It is comprised of the following:

1. an ion chamber, indicated at 1a.
2. An electrometer indicated at 1b,
3. A phototransducer and optical slit system, indicated at 1c,
4. a DC potential for the ion chamber, indicated at 1d,
5. an AC potential for the electrometer, indicated at 1e,
6. a source of illumination for the optical system, indicated at 1f,
7. a DC bias potential and bias control for the electrometer, indicated at 1g,
8. a control unit containing logic to control the electrometer, as well as the system time interval measuring units, indicated at 1h,
9. high and low frequency pulse sources, indicated at 1i,
10. an OR gate to pass one of the selectable frequencies, indicated at 1j,
11. an AND gate for passing pulses to the counter during the time interval which is to be measured, indicated at 1k,
12. the primary counter and associated logic, indicated at 1L,
13. output instrument or instruments for recording the time intervals, indicated at 1m,
14. a visual display of each time interval reading may also be employed, indicated at 1n.

Figure 2:
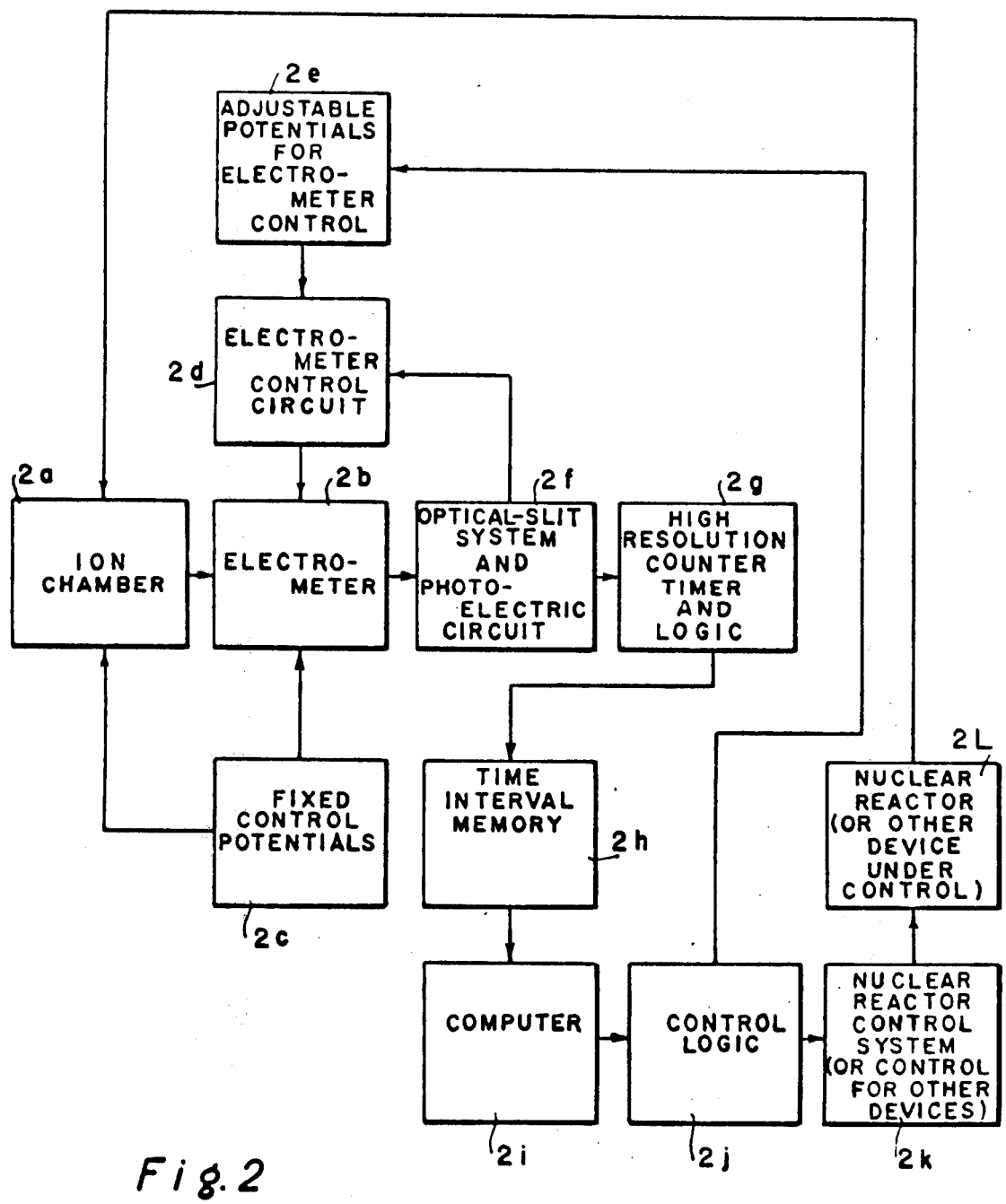
FIG. 2 is a block diagram illustrating the basic components of a system suitable both for nuclear reactor flux level measurement and power output control.

IN FIG. 2 the digital electrometer scaler, adapted for use as a control system, is seen to comprise the following:

1. an ion chamber, indicated at 2a,
2. an electrometer, indicated at 2b,
3. a source of fixed potentials for control of the electrometer and ion chamber, indicated at 2c,
4. an electrometer control circuit, indicated at 2d,
5. the adjustable bias potentials for electrometer control, indicated at 2e,
6. an optical-slit system and a phototransducer assembly, indicated at 2f,
7. a high resolution counter-timer, and logic, indicated at 2g. The logic performs those functions previously described for FIG. 1 at 1h, 1i, 1j, 1k, and 1L,
8. a time interval memory, indicated at 2h,
9. a computer unit, indicated at 2i,
10. control logic responsive to the photoelectric signals for control of electrometer potentials as well as the control of a nuclear reactor or other device, indicated at 2j,
11. a control system, which may be a set of control rods, a water dumping system or a scram control—in the case of a nuclear reactor; or more generally, a control device for other systems, indicated at 2k,
12. a nuclear reactor or other device under control, indicated at 2L.

Each of these components will be considered in more detail after a description of the electrometer itself.

The Shonka electrometer has recently appeared on the commercial market bearing the name of its designer. It is a highly sensitive quartz fiber instrument of rugged design and as such as desirable for reactor control applications. In conjunction with the novelties of this invention, it may also serve as a general purpose, high precision radiation measuring instrument. The heart of this binant electrometer employs a conducting quartz fiber which is clamped at one end but free to vibrate on the other. The free end is mounted so it may vibrate in an alternating electric field maintained between two fixed electrodes or binants. The quartz fiber needle will vibrate in the AC field if either of two conditions is met:

1. the fiber bears an impressed DC potential, or if
2. there is more AC potential on one binant than the other. But if neither of these conditions obtain, the quartz fiber or needle will be at rest, in both AC and DC equilibrium in the AC field. It may be noted that a DC bias potential is sometimes applied, not directly to the fiber as in 1) above but is super-imposed upon the AC potential applied to the binants. This has the effect of producing more potential on one of the binants than the other. Either of these two biasing methods may be used in the automatic operation of the electrometer.

Under automatic operation, the eyepiece reticule, against which one ordinarily observes the quartz fiber either at rest or fanned out in vibration, is replaced with a single optical slit, and if suitable control is employed, the Shonka electrometer may be operated on a fully automatic basis. The single slit may be so adjusted that the real image of the electrometer needle is focused on the slit when the needle is at rest in the AC field.

Although the Shonka electrometer is supplied for commercial use with a reflecting mirror-optical system, it has been found that a refracting lens system gives more positive operation with this photoelectric-optical-slit method of readout which is to be described. It may be noted that either mirror or lens system may be employed with this invention.

With a single slit-optical system, used in conjunction with the Shonka alternating current field electrometer, control circuitry becomes simplified since every reading with the instrument, after the initial reading, is a radiation measurement. This contrasts favorably with respect to the older, double-slit, aforementioned patent publication, which double slit system requires circuitry for distinguishing four types of measurements.

The structure shown in FIGS. 3 and 4 show two of various arrangements of ion chamber, electrometer, photomultiplier and optical system. Electric charge from the ion chamber 43 (FIG. 3 only) to the electrometer quartz fiber needle, the end view of which is shown at 34, causes the needle, which initially oscillates between positions 35 and 31 (FIG. 4 only), to come to an equilibrium or rest position. The charge-biased needle oscillates because of the AC field which is produced by applying an alternating current through wires 36 and 37 to the electrometer binant electrodes at 20 and 21. In FIG. 3 is shown a supporting base 30 which carries a source of illumination at 31. (This source of illumination is not shown in FIG. 4). The electrometer housing 33 permits light incident on the quartz fiber needle 34 to reach the lens 53. The lens is so adjusted that the real image of the fiber needle is focused on the optical slit 40, contained in the mask 39. The mask containing the optical slit is in the focal plane of the lens 53; a photomultiplier tube contained in the housing 60 is thereupon illuminated by ligth proceeding through slit 40.

In FIG. 4 the optical path is increased by employing prisms 54 and 55. The housing 58 holds the electrometer housing 33. Support 61 holds the optical slit mask 39 in related operating adjustment to the photomultiplier housing 60. Support 61 also holds prism 54. Support 62 can be seen to hold prism 55 in addition to a housing for lens 53. The optical path 10 is indicated by the dotted line.

In FIG. 3, housing 137 holds the optical slit mask 39 in the plane of focus of the real image of the needle 34. Although the diagrams show lens 53 employed to form this real image, it might have been accomplished by means of a reflecting mirror arrangement as used in the commercially available Shonka electrometer.

In FIGS. 5, 5A and 5B is shown a mask 39 and an optical slit 40, together with a superimposed real image 34 of the electrometer needle. The optical slit may be fixed or adjustable. The slit, if fixed, is ruled on an opaque mask. The mask may be a glass reticule made opaque by coating. The coating may be a metal, such as copper and silver, sputtered onto the glass. The ruling is usually machine controlled, thus removing the coating to any desired specification of width.

FIG. 5 shows an optical slit in adjustment with the real image of the electrometer needle blocking out most of the illumination. The decrease of illumination due to the presence of the real image of the needle is sufficient to produce a photoelectric control signal.

FIG. 5A shows an adjustable, mechanical slit, desirable for the practice of this invention, in that it may be opened, as shown, to facilitate one's viewing and adjustment of the real image of the electrometer needle.

FIG. 5B shows the adjustable slit of FIG. 6 in a rotated position to further facilitate viewing the real image of the electrometer needle and for making adjustments of the optical system.

One may employ a ramsden eyepiece (not shown in the drawings) for viewing the optical slit and needle image; it is necessary, of course, to first remove the photomultiplier and the photocell housing, or the fiber optics, as the case may be, from its position above the optical slit. Then a ramsden or equivalent eyepiece is set in place above the slit and adjustments may be made.

FIG. 6 shows two fixed slits 40 and 60, arranged on mask 39. The auxiliary slit 60 is perpendicular to, but also may be at an angle with relation to the principal slit 40. The auxiliary slit is usually narrower than the principal one, since its purpose is to aid the eye to locate the image of the needle and in positioning mask 39 while making initial adjustments. The initial adjustment of mask 39 requires that when the image of the needle is at mechanical rest, that is, at AC and DC null, it should be in some degree of overlapping relationship with slit 40.

FIG. 7 shows three sources of potential and three circuits useful in operating the system. At 500, the ion chamber potential is shown. The ion chamber is comprised of the chamber itself at 43 holding a collecting electrode 544 by means of a double circular insulator 541 and 543. To a conducting ring 542, supported between the high dialecic insulators 541 and 543, is attached the grounded end of the ion chamber potential 500. The high side of this potential is placed on the outer wall of the chamber.

Ions are produced in the chamber by incident radiation, 577, from source, 576, partially surrounded by shield 575. Low radiation level source material may be conveniently placed within the ion chamber.

A small relay with closing coil shown at 534, and moving armature at 512, fits inside the electrometer case, 33, adjacent to the binant electrometer shown at 550. This relay armature carries a small contactor, 513, adjusted to make and break contact with the collecting electrode, 544, of the ion chamber. Contactor 513 carries a potential from source 510 which is adjustable through potentiometer 511. This biasing potential is capable of setting the electrometer needle, 34, in oscillation when the needle is in an AC field.

Another potential at 530 controls relay coil 534 and is capable of removing contactor 513 and thus removing the source of bias 510 from the electrometer-ion chamber-conducting electrode comprised by 34 and 544 in connection.

It may be noted that the bias supplied by potential source 510 must be opposite to the charge collected by the ion chamber due to the impressed potential from source 500.

The mode of operation of the electrometer in conjunction with the single-slit-photoelectric arrangement will now be described.

Referring to FIG. 7, the electrometer quartz needle 34 and ion chamber collecting electrode 544 are permanently connected. Together they constitute the systems charge-holding conductor. This conductor may receive charge in two ways. Either from the ion chamber or through contactor 513 from potential source 510 which is adjusted by potential divider 511.

After contactor 513 is withdrawn from the charge-holding conductor 34-544, charge produced in the ion chamber 540 due to radiation 577 from source 576 in shield 575 is collected onto the charge-holding conductor system. On the other hand, when contactor 513 is in connection with the charge-holding conductor 34-544, the charge from the ion chamber leaks off to the ground through potential divider 511, and the charge-holding conductor system is held at a fixed bias potential determined by potential source 510 and potentiometer 511.

If we suppose that a negative charge is left on the charge-holding conductor 34-544 when relay coil 534 becomes energized, thus removing contactor 513 from 34-544, then a positive charge from ion chamber 43 collected at electrode 34-544 will cause the negative charge thereon to be neutralized, supposing that charge from the ion chamber is permitted to collect over a sufficiently long period of time.

When this balance of charge is effected needle 34, FIG. 7, will no longer oscillate in its AC field and the real image of the electrometer needle will be in focus over optical slit 40 (FIG. 3 or 4). This produces a signal in the photomultiplier circuit (li of FIG. 1), which in turn energizes relay 533 thereby de-energizing coil 534 by the removal of potential 530. Immediately thereupon negative biasing charge is returned to the charge-collecting conductor 34-544 and needle 34 resumes its state of oscillation. In this manner the system operates continuously first charging the conductor and needle and then permitting ions of opposite charge from the ion chamber to collect on the charge-holding conductor.

It is clearly evident then in a series of such measurements the same electric signal that energizes relay 533 may also operate a time-measuring system to indicate the time interval, $\Delta t$, required for the charge from the ion chamber to balance the known initial biasing charge that is placed on the charge-collecting conductor 34-544 from source 510. Basically, the current, $i$, from the ion chamber may be expressed in terms of the time interval, $\Delta t$, required for the equal and opposite potential, $\Delta V$, caused by equal and opposite charge $\Delta Q$ (described above) to balance one another.

Thus $$i = \frac{\Delta Q}{\Delta t} \text{ and } i = c \frac{\Delta V}{\Delta t},$$

where C is the capacitance of the charge-collecting conductor 34-544.

We now return to a description of the reactor system as a whole. Referring now to FIG. 2, block 2L symbolizes a nuclear reactor or other type of device, as, for example, a Production Process. Block 2K indicates a control device for 2L. In the case of the nuclear reactor, 2L symbolizes not only control rods but also an electro-mechanical assemblage capable of inserting or retracting the shim rod. An on-line computer at 2i not only permits the control of the reactor to any desired level of power output but also makes possible a complete analysis of core power distribution. In addition, it is capable of generating physics data and plant performance data for measurement, control and production of nuclear power.

For reactor application a suitable type of ion chamber tube may be employed at 2a (e.g., the Westinghouse Compensated Ionization Chamber WL-6377). It may be mounted in or near the core lattice for continuous monitoring of neutron flux levels. Several such ion chamber type tubes may be employed in conjunction with a given reactor core. In FIG. 2, it is seen that reactor 2L connects back to ion chamber 2a. This link symbolizes the neutron flux level within the reactor core, at any instant, producing current within the ion chamber. Control unit 2k is effective for removal or injection of control rods in the reactor lattice in response to the ion current levels maintained in the chamber by the neutron flux levels in the core.

The on-line computer 2i is usefully employed to receive and store in memory flux level information in the form of digital time interval readings. It is capable of output signals to control unit 2j which in turn controls both the electrometer bias potentials at 2e as well as the reactor-power levels by means of control 2k.

NUCLEAR REACTOR

We consider now the details of reactor control. We may assume that numbers, representing time interval values, which are proportional to the ion level in chamber 2a and therefore also proportional to the flux of nuclear reactor 2L are continually being generated. Then, they are stored in time-interval memory 2b. This memory is buffer input storage for computer 2i and may be considered as separate from or an integral part of the computer.

The central computer core and processor of 2i may be employed on a time-share basis for the purpose 1) of determining the flux levels within reactor 2L due to ion levels produced in chamber 2a and, for the purpose 2) of calculating and performing other programmed services for the entire system.

Both the computation of reactor flux levels and the performing of other services for the system may be accomplished by computer software. C. E. Cohon in a U.S. Pat. No. 3,424,653, gives an example of a software flow diagram for reactor start-up control. However, in place of software, logical hardware, which is not distinguishable from the computer itself, may be employed for computation, logical decision and control. A computer device employing logical hardware only, without stored program, may be preferred to the stored program computer especially for those applications where the computer operations are relatively few and are repeated on an almost continuous basis.

If central core memory and the central processing unit are not used on a time share basis, then the updating of flux levels from input, time interval data and the computing of excess reactivity may be accomplished by a separate processor designed for this purpose incorporating its own hardware for doing logic and even with its own core memory thus minimizing software requirements.

As pointed out above, logical hardware need not be distinguished from the computer itself; for the computer is a collection of logical circuits designed to perform various operations, including mathematical, physical (such as printing, plotting, opening or closing valves or moving reactor control rods) and also decision type, selection operations. This decision type, selection capability gives the computer its tremendous power as a practical tool; furthermore, as is evident, software is not required for this latter capability.

As an example of computer without software one may cite the computer controlled train (as the BART system), which is not stored, stopped or controlled by a software computer, but by hardware, i.e., by the logical hardware units that are integral parts of the many control computer units.

An example of a computer applicable to our purpose in the IBM system/7 which is both a sensing and controlling, online type of computer.

The principal quantity for calculation in reactor control is reactivity. Close to zero, positive reactivity, the e-folding time, i.e., the period, is large, while at zero reactivity, the period is infinite. The (excess) reactivity, rho, equals $(K_e - 1)/K_e$, where $K_e$ is the effective multiplication factor or reproduction constant.

The power in the reactor is given by $$P_t = P_o e^{\pm t/T}$$

where $P_o$ is the power at some initial time, $t = 0$ and $P_t$ is the power at some later time $t$. The period, T is defined, $$T = K_e \, g/(K_e - 1) = g/rho$$

where $g$ is the average generation time of neutrons and is of the order of 0.001 sec for thermal reactors which are prompt critical, and of order $1 \times 10^{-6}$ sec for prompt critical fast reactors, which reactors if made delayed critical are amendable to normal control procedures as described herein for automatic control with this invention. The generation time of neutrons is of order 0.1 sec if the reactor is delayed critical. Reactor power is proportional to the average neutron flux density. Thus, power will also be proportional to the ion level in chamber 2a. At critical, $K_e = 1$; but if the excess reactivity is positive, $K_e$ is greater than 1; and if the excess reactivity is negative, $K_e$ is less than 1.

If there is a positive excess reactivity, then after one period the power goes up by a factor of $e \simeq 2.72$. Thus, if one supposes a near zero positive reactivity when the reactor output is for example, 100 megawatts, then, at the end of one period, the reactor power will be 2.72 × (100) megawatts.

Close to the zero reactivity, reaction times are relatively long so that the control rods, which take care of excess reactivity might easily be manipulated by hand. This shows that when a reactor is being operated, since reactivity is always kept close to zero, there is never a squeeze on time for automatic control by means of a computer. It is usually a shim rod that controls the slight excess reactivity while a number of rods are adjusted in such a way as to make the excess reactivity slightly positive so that the shim rod easily controls the excess.

For automatic control of a reactor:

1. There must be a set schedule of power levels to be maintained,
2. A sensing device for obtaining neutron flux data from the reactor core,
3. A method of calculating the reactivity and the power level,
4. A control device in the reactor; this is a control or shim rod; automatic control requires that this control rod be motorized; or that an electromechanical device be supplied capable of inserting the rod for absorbing the positive excess reactivity and retracting the rod for increasing the reactivity; one or more motors — conveniently step-motors that take step in response to a single power pluse — may be used for this purpose,
5. A method of calculating the amount of control required for the rod is required; if a step motor is employed one must calculate the number of pulses required to move the rod a distance to increase or decrease the reactivity by a certain amount; hence, the rod must be calibrated,
6. An on-line computer interfaced with the sensing device and the control device which is capable of making all necessary calculations,
7. The rod calibration data must be in the computer together with a stored program and the schedule of power levels to be maintained.

Returning now to the description of FIG. 2, control logic, symbolised at 2j, is interfaced with on-line computer 2i. (Unit 2j may be considered an itegral part of the on-line computer.) Internal switching symbolized at 2j has two functions: It is the switching for control-rod system at 2k and secondly, it is switching, providing adjustment for the potentiometers at 2e that control the electrometer sensitivity. This second control is a convenience but is now essential for the automatic control of the entire system.

From high resolution timer and counter at 2g, digital time-interval information is transmitted over a multiple, direct wire interface to buffer memory at 2h and again through another such multiple, direct wire interface between memory (buffer) 2h and memory of computer 2i. These interconnections and scanning are accomplished in a conventional manner as used for transmitting pulses of digital information and may be considered as internal to the computer or as a scanning operation as in a card reader.

The on-line computer signals that control the switching logic at 2j may be generated by software and/or hardware in the computer processor by determining the level of (excess) reactivity. Usually, a series of pulses transmitted via solid state or relay switching at 2j and interfaced with direct wire or through multiplexer channel techniques, drives the forward or reverse control of (step) motor (or motors) to insert or retract the control (shim) rod indicated at 2k. It will be evident that various speeds of insertion and retraction and/or lengths of insertion may be computer generated responsive 1) to the level of reactivity observed and, 2) to the known calibration of the control rod. Thus, solid state or relay switching, multiplexed or direct wire connected, applies power pulses to the motor controlling the shim-control rod of the reactor. The number of pulses transmitted to the step motor control is calculated and is dependent, basically, upon the level of excess reactivity sensed.

Control logic and switching at 2j that is capable of changing the electrometer sensitivity by pulsing a step-motor connected to drive a potentiometer at 2e (which, in turn, supplies an increase or decrease of potential across the electrometer binant electrodes), is made responsive to the magnitude of the time interval readings received from the high resolution timer and counter at 2g. Let us suppose that the desired speed of response for the time-intervals are to be greater than ten seconds but less than 15 seconds. A software routine compares each time interval with these time requirements. Resultant upon the detection of a signal outside these bounds and by means of a stored-program-computer calculation the required number of pulses are transmitted through control logic and switching at 2j to step motor (or motors) at 2e. The pulse or train of pulses (based on computer stores calibration data) increased or decreases the potential across the electrometer binants to bring the time-interval readings into line with the programmed requirement.

Returning to a discussion of control 2k, if it is desired to change the reactor power level, this may be done by control rod adjustment. Let us suppose a new higher level of power is required from the reactor. If software is employed the new power level is read in either from card or computer keyboard. Let us suppose that after each reactivity computation the average power level is also calculated and compared with the assigned power level. When the newly assigned higher power level is sensed a stored program routine thereupon calculates the pulses required for retracting the control rod so as to reach the new power level. Usually this is done in stages, alternately making reactivity readings and thus approaching the newly assigned power level in gradual steps. The speed of the on-line computer easily controls and monitors this gradual increase in power.

Switching logic at 2j may well be considered a part of the modern sensing and controlling computer. Interfacing of the modern on-line computer permits receiving and transmitting of either digital or analog signals from and to sensing instruments and control devices. The interfacing techniques of the art permit either digital or analog interfacing to either adjacent or distant equipment. Interfacing techniques are outlined in Table 1.

TABLE 1

Interface Techniques

I. DIGITAL MODE - Reading contacts for open-closed condition —
This is the language and mode of the digital computer—
A. Single Wire (plus ground)
  1. Connects the single contact of the sensing instrument to the computer input for binary (off-on) scan.
  2. Multiplexer Technique - implies two or more signals (pulses) sent consecutively on the same line and requires a scanning device at both ends of line. This is particularly adapted to long distance interfacing as between building or cities.
B. Multiple Wire
  1. Each contact of a digital sensor output is connected to the receiver station (computer or other station being interfaced) for scanning. Multiple wire interfacing may be used for digital scanning with any base system of counting but normally is more feasible with short distance interfacing.
  2. Multiplexer Techniques may be used for near-by or long distance interfacing. It is well-known how coding may be used to reduce the number of wires and how a few wires may be used for transmission over common paths by a pattern of consecutive transmission of signals. Within the art, one could say, the number of patterns is almost unlimited depending upon the situation and taste of the designer.
II. ANOLOG MODE — Reading voltage —
A. Single Wire (plus ground)
  1. Usually implies only one potential (between sensor contact and ground) to be read. The scan rate, i.e., the repetitious reading rate of the same potential depends upon the circuit design and the requirements of the system.
  2. Multiplexer techniques are applicable for shaping signal (as with unit gain amplifier or multirange amplifier) and changing from analog to digital mode.
B. Multiple Wire
  1. This usually implies reading potentials from more than one sensing instrument (one voltage per contact point). Near-by interfacing is compatible with one (or two) wire for each voltage to be scanned.
  2. Multiplexing Technique here implies:
    a. Scanning voltage points consecutively — (thus reducing the number of wires in the case of long distance transmission.)
    b. Shaping signal as required by unit-gain or multirange amplifier.
    c. Changing analog to digital reading.

HIGH RESOLUTION COUNTER AND TIMER

The high resolution counter and timer shown in FIG. 1 at 1h, 1i, 1k and 1L (also in FIG. 2 at 2g) employs a source of high and low frequency pulses fed to a counter, which counter is turned on and off by the phototransducer signal generated by the optical slit system. Digital readings from the counter represent elapsed time-intervals between successive phototransducer signals or, by an arrangement of circuit logic, time intervals between a predetermined number or batch of phototransducer signal.

Referring to FIG. 1, a pulse source 1i is capable of outputting several frequencies. A high and a low frequency, at a minimum, are desirable for the general run of applications. The utility of the low frequency is seen in a system that operates on an intermittent basis. For example, if a system is to be used for measuring the half life of longer half lived isotopes, operation on an intermittent basis is desirable. During the intervals when measurements are not taken it is desirable to keep an accurate measure of this "off" time. For the "off" time measurement, then, the pulse source 1i is operated at the lower frequency. The gate shown at 1j, controlled by logic 1h, thereupon permits the primary counter to collect pulses at a slower rate. Thus, the lower frequency prevents the accumulation of a number of counts beyond the primary counter capability. However, when it is desired to measure radiation where the time intervals are short, the high frequency pulses from source 1i are used. Fast counting with higher frequencies permits one to obtain in a short counting interval as many significant figures as possible.

It is understood that the control logic indicated at 1h and 1L in FIG. 1 are not entirely separate units. In reality, they represent the logic of the entire system but are diagrammed as separate blocks so that the flow of control may ge more easily represented.

The primary counter reading may be transferred out into a parallel, buffer memory, before it is read out into more permanent type of record; or it may be read out serially. However, whatever method of read-out is employed a minimum (but constant) interval of time is lost. This dead time, at most, is of the order of ½ second. In one instrument, a 0.75 sec. counter has been employed to inhibit the primary counter during a 0.75 sec. interval subsequent to the readout of the primary counter. Apart from this, the Primary Counter counts continuously. The dead time correction for the Primary Counter is updated at a later time in the system sequence.

In FIG. 8 is shown a schematic circuit diagram for an AC potential supply for the binants of the electrometer. The Shonka electrometer under manual operation does not require precise AC zero adjustment nor precision phase adjustment, since a reversal of the motion of the pattern in the eyepiece indicates to the operator the exact instant for the termination of a time interval reading. Nonetheless, under automatic, continuous operation, it is required that the same sharpness of focus be maintained throughout a series of measurements. This sharpness of focus is controlled both by a phase adjustment 906 as well as by the ground adjustment 904 of FIG. 8.

Indicated at 901 in FIG. 8 is a source of AC power which may be conveniently 60 Hz 125 volts. A variac is shown at 902. It may be employed as the AC power level control, supplying potential to the primary of the step-up transformer 903. For the Shonka electrometer the output of this transformer need not exceed 500 or 600 volts. The AC ground adjustment at 904 together with the phase control at 906 are together important for maintaining the same sharpness of focus, as we have said, of the electrometer needle when it is at rest in the AC field.

At 905, insolation capacitors are shown. Capacitor 908 (about 30 mmf) slightly loads the circuit. The electrometer is shown at 33 with connections for the circuit to its binants 20 and 21. The quartz fiber, the vibrating member of the electrometer is shown at 34.

Various methods may be employed to stabilize the AC null adjustment of the electrometer. For example, temperature control of the critical circuit elements of FIG. 8 will hold the electrometer in AC null adjustment.

Another method is shown in FIG. 9. Suppose that DC bias is removed from 34–544, the electrometer's collecting electrode of FIG. 7, so that the needle 34, is at AC null, except for the final adjustment of ground at 904 and phase at 906 (FIGS. 8 and 9). At 931A FIG. 9, a photomultiplier tube is shown connected through resistors 940 and 941 to ground. A differentiator circuit at 950 is employed to sense the rate of change of current in resistor 940. Assume that the output of 950 is positive when di/dt of resistor 940 is increasing; is negative when di/dt is decreasing and is zero when di/dt is zero. At 960 is indicated a polarity sensing circuit, a motor drive, and circuit logic for alternately driving, first motor 903 and grounding potentiometer 904, and then motor 905 together with phase potentiometer 906. (Potentiometers 904 and 906 are also shown in FIG. 8.)

Basically, the circuits of 960 do the following: they set in motion alternately motor 903 and 905; if di/dt is positive they reverse the direction of drive of the motor; if di/dt is negative, they continue to drive the motor; if di/dt is zero, they stop the motor. Logic at 906 is also programmed for tow or more successive, double adjustments of potentiometers 904 and 906, first driving one, then the other, the adjustments occur automatically. Adjustments may be programmed to occur between a batch of readings of the instrument or even to interrupt a series of readings. Such as arrangement will maintain the instrument continuously in AC null adjustment.

SENSING DEVICES

Sensing devices are varied, and many types are known in the art of control. The tachometer, the pressure transducer, the thermocouple, the flowmeter and potentiometer as well as the basic ion chamber and various types of counters are able to provide analog and digital information, useful in the control of automated systems.

New sensing devices which are basic to the present invention are the following:
1. Ion chamber, electrometer optical digitizer
2. The light chopper
3. The optical digitizer
4. The optical tachometer
5. The flux-optical digitizer
6. The spectro-optical digitizer
7. The specto line-intensified digitizer
8. The flow optical digitizer Each of these sensing devices is an arrangement of instrumental parts which together constitute a new device for obtaining digital or analog signals.

The ion chamber, elctrometer, optical digitizer employs an alternating current quartz fiber electrometer together with a high resolution counter and timer. It has been described by means of FIGS. 1–9. It is basically a current digitizer.

The light chopper employs an arm mounted on a rotating shaft. The shaft and arm are so positioned relative to a mask containing an optical slit aperture that upon illumination from a source of electromagnetic flux, light pulses are produced, and also photoelectric signals. The rotating arm is so mounted that it decreases light flux at the optical aperture during a portion of its path of motion. (See FIG. 10 later to be described). A phototransducer mounted opposite the source of flux changes the light pulses to electric signals. The entire arrangement including the phototransducer is called a light chopper.

Thus, a light chopper is comprised of: 1) an arm mounted on a rotating shaft, 2) a mask containing an optical slit aperture, 3) a source of electromagnetic flux, with or without a focusing lens, 4) a phototransducer. A variable speed motor may supply input to the light chopper by being connected to drive the rotating shaft. The mask is so positioned relative to the rotating arm that upon being illuminated by electromagnetic flux, light pulses are produced at the optical aperture during a portion of the path of motion of the arm either directly by the arm or by its real image when a lens is employed. The phototransducer is mounted to receive light flux only through the optical slit aperture. Output from the light chopper are the phototransducer signals.

The optical-digitizer is a light chopper operating together with a high resolution counter-timer. The latter consists of a constant source of electric pulses of known frequency, a counter to count the pulses and additional logic, one form of which has been described earlier. Additional logic not yet described would employ time delay circuitry and appropriate gating to count and sort the photoelectric signals of the chopper either singly or in batches over periods of real time, thus to produce various time interval readings related to the angular motion of the shaft of the chopper. Input to the optical-digitizer is through the rotating shaft of the chopper (See FIG. 13).

Output from the optical digitizer is two types of signal in real time and the difference between any two signals of one type represents two kinds of time interval measurement. The first type of signal yeilds a count of the shaft rotations. The second type yields a count of the shaft revolutions that are below an adjustable threshold frequency. It should be noted that all readings can be referred to real time.

With the optical-digitizer counting may be undertaken with respect to more than one threshold frequency. For each threshold frequency a counter, a time delay circuit and logical hardware are required. The arrangement will consist of an AND gate whose output drives the counter, but having two inputs, both being driven by the output of the phototransducer. One of the inputs, however, is connected to the output of the phototransducer through a variable time delay circuit. The time delay circuit opens its own circuit path to the AND gate for a time interval that starts upon reception of each signal from the phototransducer and terminates after an adjustable time determined by the time delay circuit itself. It is seen therefore that the threshold frequency for counting pulses is adjustable by means of the time delay circuit since counts will be made by the counter only when the duration of each time signal from the phototransducer exceeds the time interval set on the time delay circuit. However, the time interval set on the time delay circuit must not coincide with the rotation period of the arm. Further logic can provide this.

The optical tachometer employs a rotating arm attached to the shaft together with optical slits and a phototransducer so that rates of rotation may be measured. (See FIG. 11 later to be described). When this arrangement is used in conjunction with a high resolution counter timer it is called an optical tachometer. The shaft of the optical tachometer may be driven by a rotating shaft (like the speedometer of an automobile) or by means of a motor and clutch.

The flux-optical digitizer is an arrangement similar to the optical digitizer except for the driving mechanism. (See FIG. 12 later to be described). A glance at FIG. 12 shows a radiometer-like structure carrying rotating fins. At 12 and 13 of FIG. 12 arrows represent radiant flux. This flux may be electromagnetic, ion flux, a flux of electrons, and so forth. Such flux includes, of course, the line spectra encountered in use of the various types of modern spectrophometers. (such flux also includes the ion flux encountered in gas chromatography.) Because this instrument measures flux, the entire arrangement including the rotating fins and the high resulution timer and counter, is called a flux-optical digitizer.

The spectro-optical digitizer is an optical digitizer driven by a variable speed motor (such as a D.C. voltage controlled type) which in turn is connected to the output of a photomultiplier-amplifier (or phototube-amplifier arrangement). The cathode of the phototube or photomultiplier is arranged to receive one or more of the principal emission or absorption lines from the infra-red, visible or ultra-violet spectrum of a sample under measurement as is conventionally done by modern spectrophotometer techniques. This entire arrangement from spectral line source to the high resolution counter and digitizer is called a spectro-optical digitizer. It is shown in FIG. 15 in which a reactant vessel containing material under observation is shown at 1000.

The spectro line-intensified digitizer is seen to be similar to the spectro-optical digitizer. It employs an image intensifier between the prism, line-selector (commonly used in a spectrophotometer) and the photomultiplier and amplifier. The image intensifier may be required to observe weak lines difficult to observe (in the infra red) and characteristic of various organic molecules. The arrangement is shown in FIG. 16 in which a reactant vessel containing material under observation is shown at 1000.

The prism, line selector is a mechanically rotatable prism used to produce a spectrum of the sample (reagent product) under observation and contains also controls to select any portion of this spectrum for further observation.

An image intensifier is an electronic device containing a high voltage source and capable of intensifying a very weak image focused on the intensifier. These devices are producing spectacular changes and discoveries in the realm of astronomy. Another application employs the image intensifier and camera as a sensing device for a production system. In this application the spectral image is intensified by one or more intensifiers in series. The output of the last intensifier is than scanned with a camera and the scanned image is stored in digital memory. The stored image is handled from there on as digital information and may be used as data with a stored program or with an all hardware computer to produce control for an automated production system.

The flow-optical digitizer is a digital flow meter. It is comprised of an optical digitizer driven by a propeller mounted in a flow stream. The propeller is responsive to the velocity of flow of the stream. The propeller shaft is interconnected to drive the shaft of the optical digitizer. Readings of the digitizer are calibrated in terms of known velocities of stream flow.

We now return to a more detailed description of the Figures.

FIG. 10 shows a plan view of an optical-aperture, rotating arm, light chopper. It is intended for use in conjunction with a phototransducer (not shown). With the phototransducer it is called a light chopper. When used in conjunction with a counter-timer (already described, see high resolution counter and timer) it is called an optical digitizer. The end of a rotating shaft is shown at 20. The shaft carries an arm, 34 rotating in the plane of the circle, 70, in direction, 10. An optical slit, 40, in a mask, 39, which is either close enough to arm, 34, that optical flux incident on the slit and phototransducer (not shown) may be interrupted, or a real image of the arm, 34, produced at the optical slit, 40, by a lens (not shown) may be employed to produce phototransducer signals.

FIG. 11 shows an optical-aperture, rotating arm angle indicator. The rotating shaft is shown at 20. The shaft carries arm, 34 which is attached to a spring return mechanism shown at 8. Essentially the device, used in conjunction with one or more phototransducers and a light source, together with a counter-timer is a rate meter, producing signals whenever the arm (or its real image) decreases light flux at an aperture. These signals may be used to start and stop the counter-timer as well as to control a clutch which in turn may be employed to drive the rotating shaft. The circle at 70 shows the plane of motion of the deflecting arm 34. Mask 39 contains optical slits 40, 41 and 42. The plane of the slits may be close enough to arm 34 to permit the arm itself to interrupt light flux at the slits or, if at a distance, the real image of arm 34 may be employed to obtain photoelectric signals. Alternately, mask 39 may be made adjustable so that with only one slit a given deflection may be monitored and maintained.

FIG. 12 shows a plan view and a side view of a radiometer-like structure. It is a flux driven, optical aperture rotating arm light chopper and is part of an arrangement called a fluxoptical digitizer. Shaft 101 carries two sets of vanes upon which radiant flux at 12 and 13 impenges as in a radiometer. Vane pairs 10 and 11 as well as pairs 20 and 21 are coated on one side so that the radiant flux at 12 and/or 13 can drive shaft 100 in rotation. The coating may be opposite on the pairs (not shown in FIG. 12) so that the shaft rotation effected by the pairs, is in opposition. For light pressure measurements this assembly of vanes should be maintained in a vacuum. The shaft also carries an arm, 34 which is able to modulate light flux shown at 14, illuminating slit 40. Collar, 100 mounts arm 34 and permits its adjustment.

Suppose radiant flux 12 is a constant, standard known source of flux, capable of producing a given rotation of shaft, 100. An unknown flux at 13 can be measured if either the real image of the arm or the arm itself interrupts light flux, 14, incident upon optical slit, 40. It is understood that this device is to be used in conjunction with a phototransducer together with a counter and timer. When this is done the entire arrangement is called a flux-optical digitizer. See FIG. 14.

For application of the flux-optical digitizer to reactor control, vane pairs 10 and 11 of FIG. 12 may be coated with a wide variety of materials: cadmium, Boron-10, rare earth metals, U-235 and other such materials, and especially those that are able to present suitable cross sections to the neutrons under measurement.

It has been recognized since 1903 that the forces exerted on rotating vanes by the recoiling molecules of a rarefied gas are many thousands of times greater than the radiation pressure itself that is directly caused by the incident radiation. It is also known from the work of Cartwright and Strong (Cf. Strong, J. *PROCEDURES IN EXPERIMENTAL PHYSICS*, New York, Prentice Hall, Inc., 1938, Ch 8, P. 305) that the most efficient pressure for obtaining large momentum amplifiction from the gas in a radiometer is 0.06 mm of mercury.

Now it is evident, that in the case of a radiometer driven by a beam of luminous flux, all of the driving energy must be derived from the incident beam. This is also true for the flux-optical digitizer driven by a beam of neutrons: all of the driving energy must come from the beam of neutrons unless a fissionable material is employed as coating on the rotating vanes.

Of course, a beam of radiant flux carries both energy and momentum. With this in mind, three situations relative to this invention may be distinguished.

1. The case of perfect reflection. If a beam of incident radiation, photons or particles, strike the rotating vanes of a radiometer or flux-optical digitizer, maximum momentum is transferred from the beam to the vanes if the beam is perfectly reflected. Furthermore, for the case of perfect reflection, zero energy is transferred from the beam to the vanes.

2. The case of total absorption. If the beam of incident radiation photons or particles, is totally absorbed by the vanes, one-half of the maximum momentum described in the case of perfect reflection is transferred from the beam to the vanes.

For this case of total absorption, the total energy of the beam is transferred to the vanes and, we will suppose, appears as heat. A vane is so designed so that the heating effect takes place in a coating on one side of the vane. The coating is desirably insulated from the vane itself so that a temperature differential is established between the two sides of the vane. This design makes possible the momentum transfer to the vane effected by the faster rebounding gas molecules from the heated side.

It has long been known that the momentum transfer between a gas and a rotating vane heated on one side is thousands of times more effective for producing rotation than the maximum momentum transfer between beam and vane as described for case (1) above.

3. The case of employing fissionable materials. If one employs a vane coating that contains fissionable material and if we suppose a beam of radiation such as neutrons incident on the vanes, it will no longer be necessry that we depend upon the beam for the driving energy, since a preponderous source of energy is stored in the vanes. This source amounts to 176 MEV per fission. Here the neutrons or particles in the beam function to release this energy.

In this case it is desirable to employ a thin overcoating of a suitable metal, electrolytically deposited to prevent the escape of fission fragments from the rotating vane.

With low levels of neutron flux incident upon a flux-optical digitizer that are not capable of overcoming the shaft and air friction of the digitizer (supposing that fissionable material is not employed for coating of the vanes) vanes 20 and 21 of FIG. 12 may be driven with a constant, fixed source of optical flux, indicted at arrow 13 of FIG. 12. With this arrangement, beam pressures, many orders less than the minimum necessary to overcome the digitizer's friction forces may be measured by the system.

In the application of the flux-optical digitizer to the control of a reactor, it is necessary to calibrate the digitizer. When the digitizer employs only one arm and one optical slit, as shown in FIG. 12, each recorded time interval corresponds to one revolution of the digitizer shaft. Hence, the time intervals are periods, T, of the shaft rotation. These time intervals may be turned into instantaneous values of angular velocity, $\omega$, of the Shaft in accordance with the relationship:

$$\omega = 2\pi / T$$

To calibrate the flux-optical digitizer, one allows the neutron flux of the reactor to drive the digitizer and for each power level of the reactor a reading is made of the angular velocity. Once the corresponding values of angular velocity and reactor power level are known, they may be stored in computer memory for employ by the computer for reactor control.

PRODUCTION SYSTEMS

Under the general name of production systems I wish to describe various types of production apparatus, systems and reactions which linked by computer and by means of sensing and control elements may be automated.

If one makes a general analysis of the production system he will find the following elements:

1. A process where different states may be distinguished,
2. A process where some quality distinguishing the state may be measured by a sensing device,
3. A process in which the distinctive quality may be controlled by a control device.

The general analysis will also reveal that to automate such systems or even to operate them one further needs 4. A linkage for the system (possibly found within the system itself) consisting of:

a. Interconnection (at least logical if not physical or mechanical) of sensing and control devices,
b. Use of information from the sensing device, to
c. Manipulate the control device. This is sometimes called "feedback".

The analysis also reveals that the more powerful linkage will have the following properties:
d. Capability for mathematical computation,
e. Capability of making logical decisions.

It should be clear that production systems, taken in this wide sense, include planes flown by human or automatic pilot and autos driven at a constant rate of speed either by a person or by a gadget that holds the speed at a set value.

PLUTONIUM PRODUCTION

We have already described the production of power by means of a reactor. Not greatly different is the production of plutonium in that with the computer linkage for control of the process one may compute the plutonium output. In general, the plutonium rate of production is proportional to the reactor power level. Hence the computer must log the intervals for each power level of operation. For an unenriched thermal reactor with carbon moderator the output is roughly one gram of plutonium per megawatt day. The old (wartime) reactors at Hanford were unenriched. An enriched reactor produces less plutonium. In general, the amount of plutonium produced depends upon several factors, for example the enrichment of the fuel and the geometry of the lattice structure.

Water moderated reactors require enrichment (unless heavy water is used). Hence the boiling water and pressurized water reactors require enrichment and thus would produce less plutonium.

It can be seen, then, that a stored program may contain all the necessary information for calculating the plutonium production inventory.

GASEOUS DIFFUSION SEPARATION

Another type of production system is the gaseous-diffusion separation plant employed for the separation and concentration of U235 from U238. As a first step toward the automation of the system one requires a sensing device that can distinguish the various levels of enrichment of U235. The sensing device suggested by this invention requires a probing beam of neutrons, preferably thermal neutrons, and an absorption path through which they must pass. The absorption path contains uranium hexaflouride and such paths and sensing instruments may be supplied at various stages of the separation where it is desired to monitor and measure the U235 concentration. After neutrons from the probing beam pass through the absorption path they are directed to strike one of the rotating fins of the flux-optical digitizer. As the separation process produces higher and higher levels of U235 at a given instrument location the thermal probe beam is further and further attenuated and the rotating fins of the flux-optical digitizer, rotating in and out of the beam, undergo less and less momentum exchange with the impacting thermal neutron beam. Thus the speed of rotation will be decreased and the time intervals from the digitizer will increase.

Control of the gaseous diffusion process requires control valves for various purposes. First, when a desired enrichment of U235 is attained a bleeder valve draws off the gaseous product. Again routing valves are employed to reroute the unfinished gaseous products.

REACTOR CONTROL

The flux-optical digitizer may also be used in conjunction with neutrons from a reactor core to measure core flux. By employing neutrons, for example, thermalized neutrons from the reactor core and by adjusting the beam for incidence on the fins of a flux-optical digitizer one may obtain readings related to the core flux levels. With an on-line computer interfaced both, with the flux-optical digitizer and the control rod mechanism, and by means of a stored program, one may automate the system. Of course, for most applications the instruments of this invention require calibration.

CHEMICAL REACTIONS

A chemical reaction together with the vessel or vessels in which it is produced and maintained may be thought of as a production system. Many reactions may be monitored and controlled by employing the new sensing devices described in this paper.

As an example let us suppose a vessel contains copper sulfate solution at some concentration. Now just as one measures the concentration by means of an optical spectrophotometer so one may employ the spectro-optical digitizer to obtain digital output. The digital readings will correspond to the intensity of lines under measurement.

If the copper sulfate solution is supplied with electrodes the concentration may be controlled by passing current through the solution. A current passing in one direction will remove the sulfate ion and, passing current in the reverse direction will bring it back into solution, supposing the electrodes are such that deposition takes place only on one electrode. It should be clear that by means of an on-line computer, capable of sensing the molecular-ion concentration of the sulfate ion as just described, and by also controlling current in one direction or the other through the solution according to a schedule of concentrations, as may be required, the whole process may be automated. It is understood that the computer may also calculate the current required to produce a given required concentration starting at a given measured concentration, since a current of one Faraday will deposit one-half mole of copper. To control current in the cell one may employ a step-motor driving a rheostat in series with a voltage source and the cell itself. The step-motor is interfaced with the on-line computer where a stored program is employed to produce control for the flow of current in the cell and thus to maintain the solution concentration according to any desired schedule.

Another example is of an ionic reaction employing temperature control. See Laboratory Physical Chemistry by Oelke/M.A.C.T.L.A.C. (1969) Van Nostrand Reihnold pg. 328 and sqq. The reaction involves an aqueous solution of potassium iodide and potassium persulfate forming free ioding. The free iodine concentration may be sensed by a spectro-optical digitizer. The principal iodine spectra is brought to focus on the cathode of the photomultiplier. The digital output is interfaced to the computer. Temperature sensors in the reactant are also interfaced to the computer. The computer is of the on-line type with stored program and has internal capability of scanning all input sensing points. Because of stored program capabilities a wide range of control is possible. Calibration data is included in computer memory so that the digital response of the spectro-optical digitizer is related to the solution concentration of the free iodine. Control of the iodine concentration is by supplying a level of heat to the reactant. For this control a rheostat controlled by a step-motor may be used to change the heating coil wattage at the reactant vessel. The stored program calculates the number of pulses required to change the wattage of the heater. Of course the step-motor is digitally interfaced to the computer.

It is understood that there are many chemical reactions for which an increase or decrease in molecular concentration is not measurable by observations employing the visible spectrum. For such reactions the modern techniques of the infrared and ultraviolet spectrophotometer are very useful. Thus, employing absorption or emission lines in the infrared or ultraviolet and directing these lines upon the cathode of the spectro-optical digitizer one may obtain measurements of molecular concentration levels. As with the spectrophometers the use of the spectro-optical digitizer requires standardization. This implies a curve, or data for use in the computer, by which the response from a particular digitizer may be read as a concentration. This is possible if the instrument has been previously calibrated against samples of known concentration for the reaction system in question.

FIG. 17 shows a reactant vessel at 1000 carrying a substance to be reacted which is under temperature control and spectral observation. Another reactant shown at the rectangle labelled "reagent source", is being introduced into vessel 1000 through a valve that is controlled by a pulse motor which, in turn, is computer operated. The spectro-optical digitizer, in turn, supplies information to the computer indicating the effect of the reagent in driving the chemical reaction.

One method of controlling temperature for the reaction is shown in FIG. 17 and is under computer control. A source material for temperature control is stored as shown by the rectangle in FIG. 17, and may be pumped at any desired rate as required through coils shown at 200. The valve and pump controlling this flow are also pulse motor driven and likewise under computer control. In a similar manner, catalysts may also be introduced to the reactant vessel 1000 and flow itself within the vessel may likewise be automated. Thus a highly complex control may be used to obtain reaction velocities and concentrations of reactants. The control of temperature and other physical properties of reagents or materials being synthesized are thus exemplified by the control shown in FIG. 17. In general, valves may be pressure operated or by means of motors which may be of the step variety and the reagent entry valve of FIG. 17 between vessel 1000 and the reagent source might equally well be of the pressure variety, and computer operated.

SYNTHESIZING MOLECULES

Although the last two examples of controlled chemical reactions are about the simplest possible, it should be clear that the types and kinds of chemical reactions amenable to computer control are almost unlimited. A few years ago, the synthesis of protein molecules in the laboratory was accomplished. Some workers have done this painstakingly by hand. Others have used computer techniques. Since the number of atoms in a protein molecule is so large (from 10,000 to over a million) no one would attempt to synthesize such a molecule from its atoms. However, from amino acids and other products available in quantity, man's food supply, one day, may come from computer controlled synthesizing processes. It is easy to see that only the computer could handle the complexity of preparing a protein or carbohydrate molecule's components, speeding reactions with the appropriate enzymes, controlling temperatures, pressures and radiant energy and assembling each reactant member at the proper time and place in the molecule structure, thus to produce life sustaining food for man.

It is said that each person through life requires an acre of land, on an average, for growing the food that sustains him. Food synthesizing, in a system that operates day and night — instead of once or twice a year, as for crops — may, one day, produce food, on an acre of land, such as to have, on an average, a human sustaining capability in the thousands.

SENSORS AND CONTROLS

Before turning from chemical reactions and synthesizing processes mention is made of other methods that afford a variety of simple sensing and control techniques. Besides the spectrophotometric methods mentioned there are also potentiometric, conductometry, polarography and coulometry.

The measuring of the potential of a sample in a cell is a useful technique for measuring the concentration of a constituent ionic species in solution. This is called potentiometry and the concentrations are calculated from the potential measurements. An example is the measurement of hydrogen-ion concentrations. Many manufacturing processes depend upon the continuous, accurate measurement of hydrogen-ions by the potentiometric method.

Conductrometry is another method of determining ionic concentration by measurements of conductivity. This is possible since the conductivity of a solution depends upon the nature and concentration of its ions.

Polarography, the obtaining of voltage-current data for two electrodes in a solution, can also yield information as to the substances present and their concentrations.

Coulometry, based on Faraday's laws of electrolysis and the laws of definite proportions and used with a known substance that reacts stoichiometrically with an unknown, is another method that can be used in automatic measurement and control.

Thus it is seen that electrical measuring devices in a variety of forms can be employed as sensing devices. Sensing electrodes are interfaced to an on-line computer for calculation, analysis and control of the automated process.

On the side of CONTROL, we find that photosynthesis exemplifies the extremely basis role that light radiation (electromagnetic flux) is able to play in the control of chemical reactions. There are many different types of such reactions. We mention three. First, there are some reactions that will not occur except in the presence of light. Secondly, there are those reactions that occur in the absence of light but they occur at a greatly reduced rate. A third reaction is typified in that the reaction products, after being produced by light quanta, retain in the form of chemical energy part of the energy of the absorbed photons.

From photosynthesis, which is both basic and typical of the organic, photochemical type of reaction, it is seen that reactions are controlled by means of the same factors that are known to influence these reactions. Thus in photosynthesis, temperature, light intensity, carbondioxide concentration and the presence of water, either one alone or all can be used to effect control of the process. Indeed, the very basic role of control played by temperature, moisture and radiant energy could hardly escape any student of nature when, in Spring, the unlimited variety of chemical reactions are released, bursting forth into growth and every variety of new life.

Finally we mention various types of control of the sources of light quanta. First, there is the on-off electrical switching control for the electromagnetic source itself. Secondly, automated control for manipulating absorption filters may be employed, thus selecting out light quanta from the source. Third, reflecting or shielding surfaces may be automated to control a beam of electromagnetic radiation, either to adjust the amount of beam to reach the reactant site or to deflect the entire beam from the reactant vessel. Fourth, a pulsing control may be employed so that light quanta reaches the reactant site only in pulses. Fifth, a rheostat may be employed for controlling light intensity by regulating the current in certain types of light sources.

PULP MANUFACTURING PROCESS

In the initial stage of the paper making process, even if only partially automated, there may be many sensing elements and there can be many control devices. Among the former are flow meters, pressure gauges, temperatures sensors, counters, ph value meters, color-quality-measurements as well as measurement of consistency of the pulp stock. Among the control devices there are a large number of motor driven valves where a step-motor controls both a valve and a potentiometer as are the commercially available Foxboro types. These valves may control steam, water or other types of flow. Water may be added or removed from the pulp slurry suspension to maintain the correct consistency for each stage of the process. As a flow-meter the optical digitizer of this invention might be employed. For this purpose a paddle wheel is mounted in the pipe conveying the pulp slurry. For a 3% consistency the paddle wheel rotates more rapidly than for a consistency of 5%. By driving the optical digitizer from the paddle wheel shaft the consistency may be monitored by an on-line computer which may both calculate the consistency and the water valve control setting needed to change the flow to a given desired consistency. When both the optical digitizer and the pulse motor driving the valve are interfaced to the computer this operation may be automated.

The bleaching process may also be monitored and controlled by an on-line computer. By use of the spectro-optical digitizer and by looking at the pulp flow by means of the reflected white light from the pulp, the brightness of the pulp may be read at stages along the bleaching path. For this purpose, light reflected from the pulp is directed into the cathode of the photo-amplifier unit of a spectro-optical digitizer. In this way various intensities of brightness may be monitored and digitized; upon interfacing of the digitizer with an on-line computer with stored program, the necessary valve openings for flow of bleaching materials may be calculated and controlled.

Another example from the pulp industry is the monitoring of the pulp rate of output from the driers for inventory and control purposes. By employing an optical digitizer that is driven by a rotating shaft at the pulp output end of the drier and press assembly, rates of production in real time may be monitored. The digitizer is interfaced with the computer containing a stored program. Control may also be initiated from the computer according to a schedule and transfer of output from flat bale form to roll package might also be automated.

PETROLEUM REFINING

In the petroleum refinery there are hundreds of closed, control loops that regulate the flow of the liquid or gas fractions within the process. For these closed loops a wide range of sensing elements are connected to the control devices by an instrument called an analog set-point controller. The sensing elements obtain either pressure readings, flow, temperature, specific gravity, tank levels or, for the analysis of the fractions themselves, a reading, for example, from a gas chromatograph. The controlling device is most often a valve.

The analog set-point controller is most often used with manual control. In one such type of controller the voltage derived from the sensing element, say a flow meter, called SEV (sensing element voltage) is applied to one arm of a Wheatstone Bridge. Another arm of the bridge has a voltage derived from the control device, called CDV. A difference voltage, DV, which is the amount the bridge is off balance (and found across the usual null-meter position of the bridge) is amplified and used to regulate the control device which for this application is a motorized flow control valve. While the difference voltage is approaching zero the bridge drives to balance, changing the valve opening and hence the voltage CDV which in turn changes the flow and therefore also voltage SEV until balance is reached.

For setting the flow to a new value the analog set-point controller permits the operator to manually unbalance the bridge. This may be done by changing the resistance or ratio of resistance in the other two arms of the bridge. When this is done by hand a new difference voltage is generated which again drives the system to balance. This hand control called the set-point control is calibrated and may be made to correspond to any desired opening of the valve regulating the flow.

Petroleum refineries are going more and more to automatic control that employs the computer and stored program especially for those control loops where precision control, say of blenders, are reflected in cost savings not possible with manual control.

The optical digitizer may also find application to the measurement of flow in both liquids and gasses for this industry. A paddle wheel or propeller driven by the flow may be connected to the shaft of the optical digitizer and, digital output, after calibration, may be immediately read by the operator as a level of flow. For automatic control it may likewise be fed to the computer.

Again, for analysis of the fractions, the spectro-optical digitizer and an ion-chamber electrometer optical digitizer (the latter used after the manner of the gas chromatograph) would find many applications in the petroleum industry.

It will be clear that these examples of PRODUCTION SYSTEMS are by no means complete. Other applications will be found in almost every production line and manufacturing process. Thus in the fields of glass manufacturing, food preparation, water control such as used for a city's water supply in water purification as well as in the evaporation process where desalinization of sea water is carried out, steel manufacturing and so on. Important to notice is that the fully automatic control of these processes, employing the stored program concept, often pays for itself in process efficiency.

From the foregoing and having presented my invention, what I claim is:

1. In a chemical, reaction production system,
   a. reagent material,
   b. a reaction product A at a molecular concentration to be measured and controlled,
   c. a sensing device called a spectro-optical digitizer comprised of:
      1. a first source of electromagnetic flux,
      2. a phototube-amplifier arrangement,
      3. the cathode of said phototube-amplifier arranged to receive spectral lines produced by said first source of electromagnetic flux in said chemical reaction production system due to the presence of said reaction product A in said reagent material.
      4. a variable speed motor driven by the output signal from said phototube-amplifier arrangement,
      5. a light chopper comprised of the following: a mask containing an optical aperture, an arm carried on a rotating shaft, a second source of electromagnetic flux, a phototransducer assemblage arranged to be illuminated by said optical aperture, which said optical aperture is illuminated by said second source of electromagnetic flux,
      6. said variable speed motor being connected to drive said rotating shaft,
      7. said rotating arm so arranged to impede said second source of electromagnetic flux from reaching said optical-aperture, during a portion of the path of motion of said arm, thus generating a signal in said phototransducer,
      8. a counter-timer arrangement connected to said phototransducer assemblage to produce time interval value measurements between said signals or groups of signals,
   d. said first source of electromagnetic flux and said phototube-amplifier arrangement of said sensing device being so arranged in respect to said chemical reaction production system as to be responsive to change in said molecular concentration of said reaction product A.
   e. a control device for said chemical reaction production system capable of changing said molecular concentration,
   f. a linkage between said sensing device and said control device capable of maintaining control over said control device responsive to said time interval value measurements obtained from said sensing device.

2. In a chemical reaction production system according to claim 1,
   a. said control device being comprised of:
      1. control valve equipment capable of controlling the reaction rate of said reagent material,
   b. said linkage being manual control.

3. In a chemical reaction production system according to claim 1,
   a. said sensing device capable of sensing levels of molecular ion concentration, and
   b. said control device capable of controlling said molecular ion concentration by means of control valve equipment capable of controlling the reaction rate of said reagent material.

4. In a chemical reaction production system according to claim 1,
   a. said control device being comprised of:
      1. control valve equipment capable of controlling the rate of flow of said reagent into said reagent material by means of a reagent entry valve,
      2. said reagent entry valve being controlled by said linkage.
   b. said linkage being an on-line computer interfaced to said sensing device through said counter-timer and interfaced to said control device,
   c. said on-line computer controlling said molecular concentration of said reaction product A in said chemical reaction production system by means of said control device.

5. In a chemical reaction production system according to claim 1,
   a. said control device comprised of:
      1. a radiant energy source of light quanta, and
      2. source control of said light quanta,
   b. said linkage being an on-line computer interfaced to said sensing device through said counter-timer and interfaced to said source control of said light quanta,
   c. said on-line computer controlling said molecular concentration of said reaction product A in said chemical reaction production system by means of said source control of said light quanta.

6. In a chemical reaction production system according to claim 5,
   a. said source control of said light quanta being on-off switching of said source.

7. In a chemical reaction production system according to claim 5,
   a. said linkage having the capability of calculating from said time interval value measurements the adjustment required for said source control of said light quanta.

8. In a chemical reaction production system according to claim 1,
   a. said control device comprised of:
      1. a motorized control for controlling a variable quality of said chemical reaction production system,
   b. said linkage being an on-line computer interfaced to said sensing device through said counter-timer and interfaced to said motorized control,
   c. said on-line computer having capability of calculating from said time-interval value measurements the required adjustment of said motorized control.

9. In a chemical reaction production system according to claim 8,
   a. said variable quality of said reaction production system being temperature.

10. In a chemical reaction production system according to claim 8,
    a. said motorized control being a rheostat controlled by a motor.

11. In a chemical reaction production system according to claim 8,
    a. said motorized control being a rheostat control for controlling the intensity of light quanta.

12. In a chemical reaction production system according to claim 8, a. said motorized control being a valve capable of controlling said variable quality of said reaction production system.

13. In a chemical reaction production system, in combination,
   a. reaction material of said chemical reaction production system,
   b. a reaction product A, whose concentration is to be measured and controlled,
   c. a control device associated with said chemical reaction production system capable of effecting a change in said concentration of said reaction product A,
   d. a sensing device, called a spectro-optical digitizer, comprised of:
      1. a first source of electromagnetic flux,
      2. a phototube-amplifier arrangement so connected that the output signal from the phototube of said phototube-amplifier is further amplified by the amplifier of said arrangement,
      3. the cathode of said phototube amplifier arranged to receive spectral lines produced by said first source of electromagnetic flus in said chemical reaction production system, and intensity of said spectral lines being indicative of level of concentration of said reaction product A,
      4. a variable speed motor driven by the output signal from said phototube-amplifier arrangement,
      5. a light chopper comprised of a mask containing an optical aperture and rotating arm carried on a rotating shaft, and said variable speed motor being connected to drive said shaft; a second source of electromagnetic flux arranged to illuminate said optical aperture; a phototransducer assemblage to be illuminated by said optical aperture; said rotating arm of said light chopper arranged so as to impede light from said second source of electromagnetic flux from reaching said optical aperture during a portion of the path of motion of said arm, this producing signals in said phototransducer whenever the frequency of rotation of said rotating arm falls below a threshold frequency,
      6. an optical digitizer comprised of said light chopper and a countertimer device connected to the output of said phototransducer assemblage to obtain time interval value measurements between said signals,
   e. a linkage between said sensing device and said control device capable of maintaining control over said control device responsive to said time interval values obtained from said sensing device.

14. In a chemical reaction production system according to claim 13,
   a. said control device being comprised of:
      1. control equipment capable of regulating a photochemical reaction by control of source of light quanta,
      2. said control of source of light quanta being by means of said linkage,
   b. said linkage being an on-line computer interfaced to said sensing device through said counter-timer and interfaced to said control device,
   c. said on-line computer controlling said concentration of said reaction product A in said chemical reaction production system by means of said control device.

15. In a chemical reaction production system according to claim 14,
   a. said control device being on-off switching of said source of light quanta.

16. In a chemical reaction production system according to claim 14,
   a. said control device being mechanically positioned shielding of radiant energy.

17. In a chemical reaction, production system according to claim 14,
   a. said control device being by means of a rheostat for control of light quanta intensity.

18. In a chemical reaction production system according to claim 14,
   a. said control device being a mechanically positioned filter for control of said light quanta.

19. In a chemical reaction production system according to claim 14,
   a. said control device capable of controlling a variable quality of said chemical reaction production system,
   b. said on-line computer interfaced to said control device and to said sensing device through said counter-timer,
   c. said on-line computer having the capability of calculating from said time interval value measurements the required control adjustment for said variable quality.

20. In a chemical reaction production system according to claim 19,
   a. said variable quality being temperature within said chemical reaction production system.

21. In a chemical reaction production system according to claim 19,
   a. said variable quality being a reaction rate within said chemical reaction production system.

22. A chemical reaction production system comprised of:
   a. reagent material and a reagent product A,
   b. a sensing device,
   c. a control device,
   d. a reactant vessel where reagents may be introduced and controlled,
   e. a linkage system between said sensing device and said control device,
   f. said linkage system having an associated memory device capable of storing information from said sensing device,
   g. said linkage system capable of logical decisions and, subsequent thereon, of effecting control over said control device,
   h. said sensing device being a spectro line-intensified digitizer comprised of:
      1. a source of electromagnetic flux for illuminating said reaction vessel or a portion of said reaction vessel containing said reagent material and said reagent product A,
      2. an image intensifier arranged to intensify lines in the spectrum from the said reagent product A,
      3. a photomultiplier-amplifier arranged to further amplify said lines in said spectrum obtained from said reagent product A,
      4. a motor driven by said photomultiplier-amplifier,
      5. said motor connected to drive an optical digitizer, said optical digitizer comprised of:
         a. a rotating shaft,
         b. an arm mounted on said rotating shaft, c. an opaque mask containing an optical slit,
d. an auxiliary sounce of flux,
e. said auxiliary source of flux incident on said arm of said shaft and on said optical slit of said opaque mask, and said arm and said slit being so aligned, that said auxiliary flux is impeded from reaching said slit for a portion of the path of motion of said arm,
f. a phototransducer so mounted as to receive said auxiliary flux from said optical slit and to produce a phototransducer signal resultat upon the diminution of said auxiliary flux at said optical slit,
g. a counter-timer connected to receive said phototransducer signals and to count in real time the time intervals between said phototransducer signals or batches of said phototransducer signals,
h. a storage device for storing digital values of said time intervals.

23. A chemical reaction production system comprised of:
 a. reagent material and a reagent product A,
 b. a sensing device,
 c. a control device,
 d. reactant vessel where reagents may be introduced and controlled,
 e. a linkage system between said sensing device and said control device,
 f. said linkage system having an associated memory device capable of storing information from said sensing device,
 g. said linkage system capable of logical decisions and, subsequent thereon, of effecting control over said control device,
 h. said sensing device being a flow-optical digitizer comprised of:
  A. an optical digitizer itself being comprised of:
   1. a rotating shaft,
   2. an arm mounted on said rotating shaft,
   3. an opaque mask containing an optical slit,
   4. an auxiliary source of flux,
   5. said auxiliary source of flux incident on said arm of said shaft and on said optical slit of said opaque mask, and said arm and said slit being so aligned, that said auxiliary flux is impeded from reaching said slit for a portion of the path of motion of said arm,
   6. a phototransducer so mounted as to receive said auxiliary flux from said optical slit and to produce a phototransducer signal resultant upon the diminution of said auxiliary flux from said optical slit,
   7. a counter-timer connected to receive said phototransducer signals and to count in real time the time intervals between said phototransducer signals or batches of said phototransducer signals,
   8. a storage device for storing digital values of said time intervals,
  B. a shaft with propeller so mounted in said reagent vessel so as to be responsive to the flow velocity of material through said reactant vessel,
  C. said shaft with propeller being connected to drive said optical digitizer.

24. A chemical reaction production system comprised of:
 a. reagent material and a reagent product A,
 b. a sensing device,
 c. a control device,
 d. a reactant vessel where reagents may be introduced and controlled,
 e. a linkage system between said sensing device and said control device,
 f. said linkage system having an associated memory device capable of storing information from said sensing device,
 g. said linkage system capable of logical decisions and, subsequent thereon, of effecting control over said control device,
 h. said sensing device being a spectro-optical digitizer comprised of:
  1. a source of flux producing a spectrum characteristic of the molecules of said reagent product A,
  2. said spectrum arranged to be adjustably incident upon a photomultiplier-amplifier arrangement,
  3. the output of said photomultiplier-amplifier arrangement being connected to drive an optical digitizer.

25. A chemical reaction production system as described in claim 24,
 a. said control device being an automated valve controlled by a pulse motor,
 b. said linkage system being a computer capable of logical decisions by means of software,
 c. said automated valve controlling entry of said reagent material into said reactant vessel.

26. A chemical reaction production system as described in claim 24,
 a. said control device being a motor,
 b. said motor being connected to a stirrer,
 c. said linkage being a computer connected to control said motor.

* * * * *